(12) United States Patent
Wu et al.

(10) Patent No.: US 11,149,344 B2
(45) Date of Patent: Oct. 19, 2021

(54) APPARATUS AND METHOD FOR PREPARING MULTI-COMPONENT ALLOY FILM

(71) Applicant: THE ACADEMY OF OPTO-ELECTRONICS, CHINESE ACADEMY OF SCIENCES, Beijing (CN)

(72) Inventors: Xiaobin Wu, Beijing (CN); Yan Luo, Beijing (CN); Yu Wang, Beijing (CN); Kuibo Wang, Beijing (CN); Wanlu Xie, Beijing (CN); Luosha Zhang, Beijing (CN); Lijia Zhang, Beijing (CN)

(73) Assignee: THE ACADEMY OF OPTO-ELECTRONICS, CHINESE ACADEMY OF SCIENCES, Beijing (CN)

( * ) Notice: Subject to any disclaimer, the term of this patent is extended or adjusted under 35 U.S.C. 154(b) by 202 days.

(21) Appl. No.: 16/479,123

(22) PCT Filed: Dec. 15, 2017

(86) PCT No.: PCT/CN2017/116599
§ 371 (c)(1),
(2) Date: Jul. 18, 2019

(87) PCT Pub. No.: WO2019/095486
PCT Pub. Date: May 23, 2019

(65) Prior Publication Data
US 2019/0390323 A1    Dec. 26, 2019

(30) Foreign Application Priority Data

Nov. 14, 2017    (CN) .......................... 201711125054.0

(51) Int. Cl.
C23C 14/14    (2006.01)
C23C 14/34    (2006.01)
(Continued)

(52) U.S. Cl.
CPC .......... C23C 14/3485 (2013.01); C23C 14/14 (2013.01); C23C 14/28 (2013.01);
(Continued)

(58) Field of Classification Search
None
See application file for complete search history.

(56) References Cited

U.S. PATENT DOCUMENTS 5,490,912 A    2/1996 Warner et al.
2009/0297406 A1*    12/2009 Okino .................. H05H 1/42
422/116

FOREIGN PATENT DOCUMENTS

CN    103042221 A    4/2013
CN    104593732 A    5/2015
(Continued)

OTHER PUBLICATIONS

Feb. 24, 2018 Search Report issued in International Patent Application No. PCT/CN2017/116599.
(Continued)

Primary Examiner — David P Turocy
(74) Attorney, Agent, or Firm — Oliff PLC

(57) ABSTRACT

A preparation device has a chamber, molten metal containers, a rotatable base in the chamber and having a deposition substrate, laser sets generating a dual-pulse laser, a base controller and a data collection control unit. The containers communicate with the chamber and each has a pulse pressurization apparatus pressing the molten metal into the chamber. The laser sets correspond to the containers such that beams of an emitted dual-pulse laser bombard the
(Continued)

pulsed droplets, plasmas are generated and are sputtered and deposited on the substrate forming a multi-element alloy thin film. The unit collects base temperature and displacement information, and controls the pressurization frequency of the pulse pressurization apparatus, and the emission frequency and energy of the dual-pulse laser of the laser sets controlling the frequency and energy of the dual-pulse laser bombarding the corresponding pulsed droplets. The base controller controls the base temperature, rotation and movement.

11 Claims, 2 Drawing Sheets

(51) Int. Cl.
*C23C 14/50* (2006.01)
*C23C 14/54* (2006.01)
*C23C 14/56* (2006.01)
*C23C 14/28* (2006.01)

(52) U.S. Cl.
CPC ........ *C23C 14/3471* (2013.01); *C23C 14/505* (2013.01); *C23C 14/541* (2013.01); *C23C 14/56* (2013.01)

(56) References Cited

FOREIGN PATENT DOCUMENTS

| | | | |
|---|---|---|---|
| CN | 105803404 A | * | 7/2016 |
| GN | 103281855 A | | 9/2013 |
| GN | 105575771 A | | 5/2016 |
| GN | 105803404 A | | 7/2016 |
| JP | 2001-515965 A | | 9/2001 |
| JP | 2016-522568 A | | 7/2016 |
| JP | 2016-535817 A | | 11/2016 |
| WO | 96/12587 A1 | | 5/1996 |
| WO | 2017/191083 A1 | | 11/2017 |

OTHER PUBLICATIONS

Jan. 14, 2020 Decision to Grant a Patent issued in Japanese Patent Application No. 2018-558408.
Feb. 13, 2020 Extended Search Report issued in European Patent Application No. 17908103.9.
Jul. 19, 2018 Office Action issued in Chinese Patent Application No. 201711125054.0.

* cited by examiner

APPARATUS AND METHOD FOR PREPARING MULTI-COMPONENT ALLOY FILM

This application claims the benefit of priority to Chinese Patent Application No. 201711125054.0 titled "APPARATUS AND METHOD FOR PREPARING MULTI-COMPONENT ALLOY FILM", filed with the Chinese State Intellectual Property Office on Nov. 14 2017, the entire disclosure of which is incorporated herein by reference.

TECHNICAL FIELD

The invention relates to the field of film preparation, and in particular, to an apparatus and a method for preparing a multi-component alloy film.

BACKGROUND

With the rapid development of science and technology, higher and higher requirements are put forward on the composite properties of materials. On the one hand, materials are required to have excellent toughness, electrical and thermal conductivity, so as to withstand mechanical loads and achieve long-term use. On the other hand, materials are further required to withstand high temperatures, thermal shock resistance, wear resistance and high hardness. New functional film materials have emerged as the times require, and have been developed in an unprecedented way. Multi-component alloy films (such as high-entropy alloy films) have become a kind of emerging film material with great development potential, since the multi-component alloy films have advantages of high temperature thermal stability, corrosion resistance, high hardness and high oxidation resistance.

In the preparation and performance study of multi-component alloy films, the film properties or the ability of combining with the substrate can be changed to produce different performance characteristics by increasing or decreasing the ratio of some alloying elements, changing the thickness of the film components in the thickness direction, or forming nitride or carbide films of multi-component alloys, so that the multi-component alloy films can be applied to different occasions. A preparation apparatus for a multi-component alloy film is required, with which the ratio of the alloy compositions can be arbitrarily designed, and the variation of the film compositions in thickness can be arbitrarily designed.

At present, the preparation method for multi-component alloy films mainly includes a magnetron sputtering method, an electrochemical deposition method, and a laser cladding method. High-density transition metal elements such as Fe, Co, Cr, Ni, W, Mo, V, Mn, Ti, Zr, and Cu are often used as the main elements for multi-component alloys, and most of such metal elements have high melting points. Some elements with low melting points, such as Al, Si, C, N, and B, are also used in the multi-component alloys. Due to the large difference between the high and low melting points of the alloying elements, for the magnetron sputtering method, it often needs to prepare a plurality of two-element or three-element alloy targets according to the melting point range, and then sputtering and depositing are simultaneously performed on the plurality of targets to prepare a multi-component alloy film. The magnetron sputtering method has low deposition rate, and the compositions of the obtained film is different greatly from the pre-design compositions. In preparing a multi-component alloy film with the electrochemical deposition method, a variety of electrolytes are required to be prepared, some elements cannot be electrochemically deposited on the film, and the preparation process and film thickness are not easily controlled. For the laser cladding method, a CO2 laser, a solid laser or a semiconductor laser are often used to directly melt the conveyed metal powder on the substrate, the coating prepared with this method has poor adhesion to the substrate, the compositions of the obtained film is different greatly from the pre-design compositions, and defects such as voids and pores are often present in the obtained film.

SUMMARY

An object of the present invention is to solve at least one of the above-mentioned problems, and an object of the present invention is to provide a method and an apparatus for preparing a multi-component alloy film. With the preparation method and the apparatus of the invention, multi-component alloy films with a large difference between high and low melting points can be rapidly prepared, such as a high-entropy alloy film, a film of a gas compound of a multi-component alloy can be rapidly prepared, a film with chemical compositions changing in gradient can be rapidly prepared, a multi-component alloy film with any vary ratio of alloy compositions in the thickness direction is rapidly prepared, the compositions of the prepared alloy film are more consistent with the pre-design compositions.

In a first aspect of the invention, an apparatus for preparing a multi-component alloy film is provided, which includes a chamber to which a vacuum pump group is connected, a plurality of metal liquid containers for containing high-purity metal liquids, a rotatable base for placing a deposition substrate, a plurality of laser groups for generating double-pulse lasers, a base controller, and a data collection control unit.

The rotatable base is arranged in the chamber, the plurality of metal liquid containers are in communication with the chamber, and each of the metal liquid containers is provided with a pulse pressurizing device for pressing a metal liquid into the chamber in a form of even pulsed droplets; the plurality of laser groups are in one-to-one correspondence with the plurality of metal liquid containers, and a plurality of pulsed droplets are bombarded by the emitted multi-beam double-pulse lasers respectively to generate corresponding plasmas, and the corresponding plasmas are sputtered and deposited on the deposition substrate to form a multi-component alloy film.

The data collection control unit is used for collecting temperature and displacement information of the rotatable base, and controlling a pressuring frequency of the pulse pressuring device and the emitting frequency and energy of the double-pulse lasers of the plurality of laser groups, thereby controlling the frequency and energy of the double-pulse lasers bombarding the pulsed droplets correspondingly, and realizing the automatic control of plasma film deposition.

The base controller is used for controlling the temperature, rotation and movement of the base based on the temperature and displacement information of the base collected by the data collection control unit.

The apparatus further includes a synchronizer trigger that synchronizes the emission of double-pulse lasers with the corresponding pulsed droplet in conjunction with the data collection control unit.

The apparatus further includes a detection member, and the data collection control unit is used for collecting vacuum degree and gas composition data in the chamber through the detection member to control the pumping of the vacuum pump group. The ultimate vacuum degree of the chamber of the apparatus is $10^{-6}$ Pa.

The apparatus further includes gas intake members, one of which is arranged on the chamber to control gas components in the chamber, and a plurality of gas intake members are arranged on the metal liquid containers and are in one-to-one correspondence with the plurality of metal liquid containers.

The apparatus further includes a baffle detachably disposed between the base and an acting surface where action points of all the double-pulse lasers and the pulsed droplets are located.

The apparatus further includes a plurality of focusing lenses, the plurality of focusing lenses are disposed in one-to-one correspondence with the plurality of laser groups, each of the focusing lenses is arranged between the corresponding laser group and the action point of the double-pulse laser and the pulsed droplet, such that the focus of the focusing lens is controlled to be exactly at the action point of the double-pulse laser and the pulsed droplet.

The pulse pressurizing device is provided with an exciter, and an inert gas enters the metal liquid container from the gas inlet member and is excited by the exciter to form a pulsed gas pressure, which ejects the metal liquid into the chamber in a form of pulsed droplets.

An injection hole communicating with the chamber is provided on the center of the bottom of each of the metal liquid containers, horizontal distances and vertical distances from the injection holes to the center of the deposition substrate are equal separately, horizontal distances and vertical distances from the action points of double-pulse lasers and the corresponding pulsed droplets to the center of the deposition substrate are equal separately, all included angles between extension lines of the emitted double-pulse lasers and the plane where the deposition substrate is located are equal.

The plurality of metal liquid containers are identical, and the plurality of laser groups are identical. The pulsed droplets are uniform in size and have diameters in micron level, each beam of the double-pulse lasers is focused through the corresponding focusing lens into a light spot to bombard the corresponding pulsed droplet, and the diameter of the light spot is larger than the diameter of the corresponding pulsed droplet.

In a second aspect of the invention, a method for preparing a multi-component alloy film using the above-described apparatus is provided, which includes the following steps:

placing one metal liquid in each of the metal liquid containers;

fixing the deposition substrate on the base, and controlling the position, temperature and rotation speed of the deposition substrate through the data collection control unit;

turning on the vacuum pump group in the data collection control unit to pump the chamber to be in an ultimate vacuum degree;

presetting the emitted frequency and energy of the double-pulse laser beam of the laser group in the data collection control unit;

turning on the pulse pressurizing device and the laser group in the data collection control unit, to synchronously bombard the corresponding pulsed droplets using the double-pulse laser; and after plasmas formed based on the action of the double-pulse laser and the pulsed droplets are stable and the plurality of plasmas are uniformly mixed, depositing the plasmas on the deposition substrate to form a multi-component alloy film.

In a third aspect of the invention, a method for preparing a film of a gas compound of a multi-component alloy using the above-described apparatus is provided, which includes the following steps:

placing one metal liquid in each of the metal liquid containers;

fixing the deposition substrate on the base, and controlling the position, temperature and rotation speed of the deposition substrate through the data collection control unit;

turning on the vacuum pump group in the data collection control unit to pump the chamber to be in an ultimate vacuum degree;

filling the chamber with a high-purity gas (for example, nitrogen) through the gas inlet member, and keeping the pressure in dynamic balance in a range from 0.1 Pa to 300 Pa;

presetting the emitted frequency and energy of the double-pulse laser beam of the laser group in the data collection control unit;

turning on the pulse pressurizing device and the laser group in the data collection control unit, to synchronously bombard the corresponding pulsed droplets using the double-pulse laser; and after plasmas formed based on the action of the double-pulse laser and the pulsed droplets react with the high-purity gas to stably generate gas compounds of alloy, depositing a plurality of the gas compounds of the alloy on the deposition substrate to form a film of a gas compound of a multi-component alloy.

In a fourth aspect of the invention, a method for preparing a multi-component alloy film with any vary ratio of alloy compositions in the thickness direction using the above-described apparatus is provided, which includes the following steps:

placing one metal liquid in each of the metal liquid containers according to the type of the pre-prepared alloy film;

fixing the deposition substrate on the base, and controlling the position, temperature and rotation speed of the deposition substrate through the data collection control unit;

turning on the vacuum pump group in the data collection control unit to pump the chamber to be in an ultimate vacuum degree;

according to the variation of the ratio of the pre-prepared alloy in the thickness direction, sequentially drawing a variation curves of frequencies of the double-pulse lasers of the laser groups and frequencies of the corresponding pulsed droplets in the data collection control unit, automatically adjusting the frequency of multi-beam double-pulse lasers bombarding the corresponding pulsed droplet according to the preset frequency variation curve;

turning on the pulse pressurizing device and the laser group in the data collection control unit, to synchronously bombard the corresponding pulsed droplets using the double-pulse laser; and after plasmas formed based on the action of the double-pulse laser and the pulsed droplets are uniformly mixed, depositing the plasmas on the deposition substrate to form a multi-component alloy film with any vary ratio in the thickness direction.

The invention has the following beneficial effects.

1. A multi-component alloy film with any alloy composition ratio can be deposited as needed.

2. A film of a gas compound of a multi-component alloy can be deposited as needed.

3. A film with chemical compositions changing in gradient can be deposited as needed.

4. The film compositions can be designed and programmed as needed to obtain a film of which chemical compositions is changed arbitrarily in the thickness direction.

5. The plasmas generated by the high-energy double-pulse laser bombarding the droplet target have higher kinetic energy and are deposited on the deposition substrate, the film layer has a stronger bonding force to the deposition substrate, and the formed film has good quality.

6. The droplet has a small size, the size of the focused light spot is larger than the size of the droplet, and the plasmas generated by the double-pulse laser bombarding the single droplet target have few fragments, and the obtained film compositions are more consistent with the pre-design film compositions.

7. The power of the laser can be selected as needed, and multiple materials with large difference in high and low melting points are deposited at a time.

8. The frequency of the double-pulse laser beam bombarding the droplet target is adjustable, and the deposition rate is fast.

BRIEF DESCRIPTION OF THE DRAWINGS

By reading the detailed description of the preferably selected embodiments below, various other advantages and benefits become clear for a person of ordinary skill in the art. The drawings are only used for showing the purpose of the preferred embodiments and are not intended to limit the present invention. And in the whole drawings, same drawing reference signs are used for representing same components. In the drawings.

DETAILED DESCRIPTION

The invention is described in further detail with reference to the drawings and embodiments below. Although the drawings show exemplary embodiments of the invention, it should be understood that the invention may be implemented in various forms but should not be limit to the embodiments set forth herein. On the contrary, these embodiments contribute to a more thorough understanding of the invention, and can completely convey the scope of the invention to those skilled in the art.

The technical solution adopted in the present invention to solve the technical problem is as follows. N-types of double-pulse lasers are used to bombard N-types of metal droplet targets respectively at the same distance in the vacuum chamber to generate N-types of plasmas, and the N-types of plasmas are uniformly mixed and then sputtered and deposited on the substrate. The ejecting frequency of the metal droplet target is controlled by the pulsed gas pressure. The frequency of the double-pulse laser is controlled by the discharge frequency, and the double-pulse laser is synchronized with the droplet. The frequency of the double-pulse laser bombarding some type of metal droplet target may be adjusted by a software integrated in the data collection control unit 6, thereby changing the generated plasma density of the metal, and realizing the preparation of the N-component alloy film with any composition ratio. An acting gas is introduced into the vacuum chamber, and the generated plasma may be reacted with the gas to form a film of a gas compound of the N-component alloy. A curve of the frequency of the double-pulse laser bombarding the metal droplet target changing with time is preset and programmed in the data collection control unit 6, the ratio of the components sputtered and deposited on the deposition substrate can be automatically adjusted to prepare a film of which the alloy composition ratio is changed arbitrarily in the thickness direction.

Figure 1:
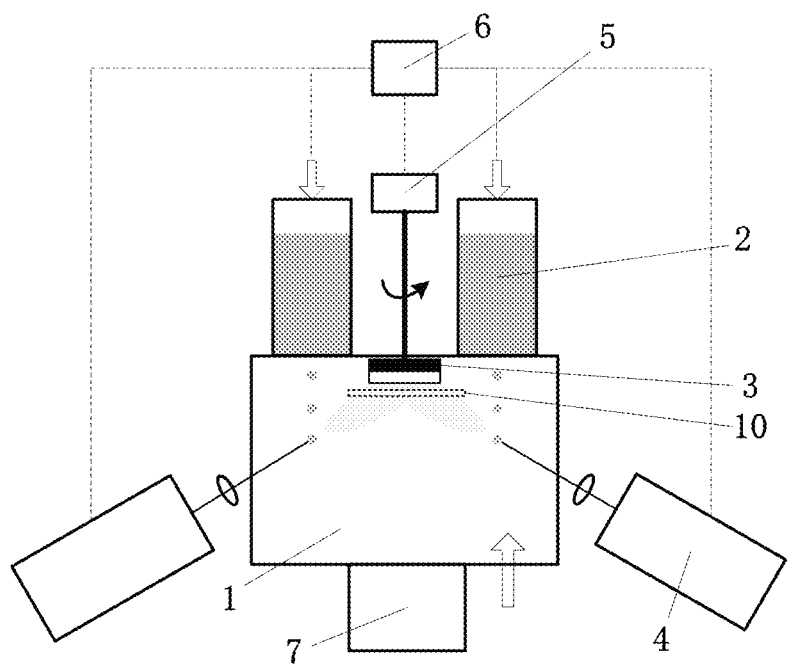
FIG. 1 shows a side view of an apparatus for preparing a multi-component alloy film according to an embodiment of the present invention.
Figure 2:
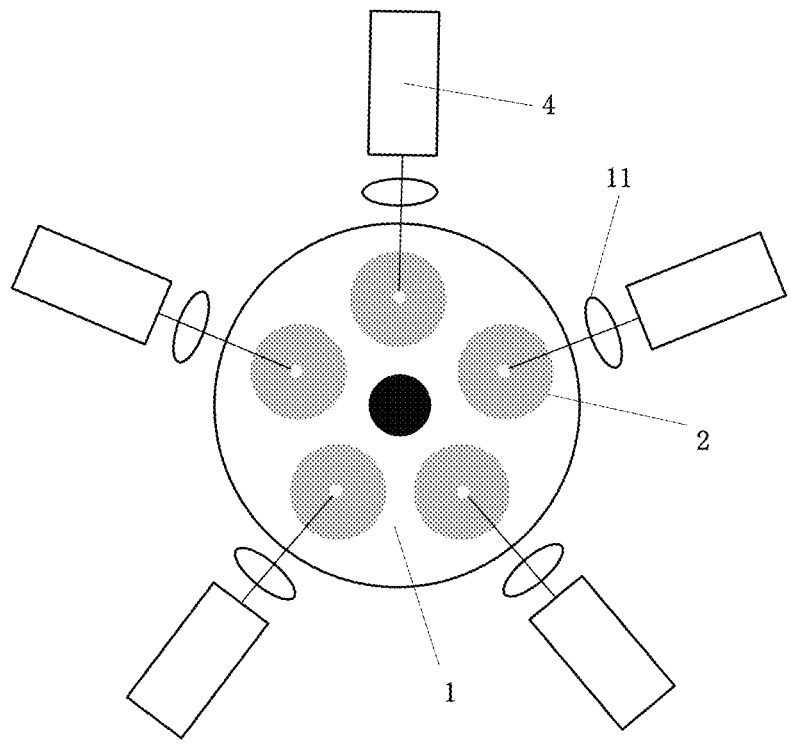
FIG. 2 shows a top view of an apparatus for preparing a multi-component alloy film according to an embodiment of the present invention.

As shown in FIG. 1 to FIG. 2, an apparatus for preparing a multi-component alloy film is provided according to the present invention, which includes a chamber 1, a vacuum pump group 7, a gas intake member, and a detection member. The chamber 1 is a place for preparing a multi-component alloy film, is in a cylindrical shape placed vertically, is made of a 316L stainless steel material with a low gas release rate, is subjected to a high temperature degassing treatment, and the ultimate vacuum degree can reach $10^{-6}$ Pa, thereby effectively avoiding chemical reactions such as film oxidation occurring during the alloy preparation process.

The vacuum pump group 7 is pumped using a mechanical pump and a molecular pump in series. A gas intake member is arranged on the chamber, and the gas intake member includes a flow controller. Some nitrogen or oxygen gas may be introduced timely into the chamber 1 through the gas intake member as needed, and a nitride or oxide film of the multi-component alloy may be prepared. The detection member is not shown in FIG. 1, which may monitor the vacuum degree and gas compositions in the chamber.

The apparatus for preparing a multi-component alloy film further includes metal liquid containers 2, a pulsed gas pressure, a base 3, a base controller 5, and a baffle 10. The metal liquid containers 2 are used for generating and accommodating various types of high-purity liquid metals, and several containers may be selected according to the number of alloy components to be deposited. Each of the containers is in a closed cylindrical shape of the same size, and the bottom of the container is connected to the top of the chamber 1 by means of a vacuum flange.

An injection hole is provided on the center of the bottom of each of the metal liquid containers 2 and used for ejecting droplets, and the distance from the injection hole to the center of the top of the chamber 1 is defined. A gas intake member and an exciter for introducing an inert gas are provided on the top of each of the containers 2, and the gas intake member and the exciter are cooperated to form a pulsed gas pressure inside each of the metal liquid containers 2. The metal liquid is ejected from the injection hole under the action of the pulsed gas pressure to form uniform pulsed droplets which have a diameter ranging from 30 μm to 40 μm and a uniform size.

The base 3 is fixed on the center of the circular top in the chamber 1 and has a circular deposition substrate to be deposited thereon. The base 3 is provided with a heating wire for heating the deposition substrate. The base 3 is provided with a thermocouple that can detect the temperature of the deposition substrate. A base controller 5 is arranged outside the chamber 1 and used for controlling the temperature, rotation and movement of the base. The baffle 10 is placed in parallel to the deposition substrate and used for bounding plasmas during the pre-sputter deposition.

The apparatus for preparing a multi-component alloy film further includes a plurality of identical optical transmission members such as laser groups 4, light beams, and focusing lenses 11. The laser group 4 can generate two pulse lasers under the action of one discharge pulse. The typical laser is a $CO_2$ laser of 10.6 μm, with a frequency range of 1 Hz to 20 kHz.

The emitted double-pulse laser beam is focused by the focusing lens into a light spot with a high energy density for bombarding the droplet metal target. The diameter of the focused light spot is larger than the diameter of the droplet, and the size of the focused light spot is in a range from 60 μm to 90 μm. A double-pulse laser bombards a droplet, and the droplet absorbs laser energy to produce metal plasmas with a high-temperature and high energy density. The plurality of laser groups 4 are placed in one-to-one correspondence with the plurality of metal liquid containers 2, and the distance from the laser group 4 to the action position of the pulsed droplets is equal to the distance from the laser group 4 to the center of the deposition substrate. A standard cone can be formed with the center of the deposition substrate and all the pulsed droplets for generating plasmas, and the deposition angle between the extension lines of the light beams emitted by the laser groups and the plane where the deposition substrate is located is 45 degrees. The energy density of the light beams emitted by the laser groups may be adjusted according to the types of metal droplets applied.

The apparatus for preparing a multi-component alloy film further includes a synchronizer trigger and a data collection control unit 6. The synchronizer trigger can synchronizes the double-pulse lasers with the corresponding pulsed droplet to form one pulsed droplet, that is, one pulsed droplet is bombarded into plasmas by the double-pulse laser of the corresponding laser group. The frequency of the double-pulse laser bombarding the corresponding metal droplet target may be controlled by software in the data collection control unit 6, that is, the frequency of applying the double-pulse laser onto the metal droplets may be increased or decreased, thereby increasing or decreasing the density of the corresponding plasma. The frequency of the double-pulse laser bombarding the corresponding metal droplet target may be preset and programmed via the software, and thus the process of plasma deposition of the film is automatically controlled. The laser beam energy, the vacuum degree of the chamber, and the gas composition may also be collected and displayed by the data collection control unit 6. The switches of the vacuum pump group, the laser group, and the vacuum detection member are controlled by the data collection control unit 6. The temperature and displacement information of the base is collected by the data collection control unit 6, and the temperature and motion of the base is controlled by the PID.

A method for preparing an N-component alloy film is further provided according to the invention. First, N identical metal liquid containers are fixed on the top of the chamber 1 to hold N types of metal liquids respectively. The pretreated deposition substrate is fixed on the base 3 in the chamber 1, and the temperature and the rotation speed of the deposition substrate are controlled by the data collection control unit 6. N matching laser groups 4 are fixed outside the chamber to ensure that the distance from the emitted light bean to the action point of the droplets and the distance from the emitted light to the center of the deposition substrate (the horizontal distance and the vertical distance) are equal. The vacuum pump group is turned on in the data collection control unit 6 to pump the chamber to be in an ultimate vacuum degree. If the atomic ratio of elements in the N-component alloy film is 1, the same laser beam energy and the same frequency of the double-pulse laser bombarding the droplet target are used. If the atomic ratio of an element to other elements in the N-component alloy film is 2:1, the frequency of the double-pulse laser bombarding the droplet target for the element is adjusted to be twice that of other elements. First, pre-deposition is performed on the baffle 10, and after the plasmas formed under the action of the lasers and the droplets are stable, the plasmas of the N types of metals are uniformly mixed after interaction. When the baffle 10 is removed, the plasmas of the N types of metals are uniformly deposited on the deposition substrate. The action period of time of the laser and the droplet is controlled based on the desired film thickness.

The preparation of a five-component alloy TiVCrAlSi film on a Ti-6Al-4V deposition substrate is taken as an example, which specifically includes the following steps.

Five identical metal liquid containers 2 are respectively fixed on the top of the chamber 1, and used to sequentially hold Ti liquid, V liquid, Cr liquid, Al liquid, and Si liquid of high purity.

The pretreated Ti-6Al-4V deposition substrate is fixed on the base 3 in the chamber 1, and the temperature and the rotation speed of the Ti-6Al-4V deposition substrate are controlled by the data collection control unit 6 so that horizontal distances and vertical distances from the injection holes of the metal liquid containers 2 to the center of the deposition substrate are equal separately.

Five matching laser groups 4 are adjusted to ensure that horizontal distances and vertical distances from the action points of light beams emitted from the laser groups 4 and the droplets to the center of the deposition substrate are equal separately.

The vacuum pump group 7 is turned on in the data collection control unit 6 to pump the chamber to be in an ultimate vacuum degree.

The laser groups 4 and the pulse pressurizing device are turned on in the data collection control unit 6. The same laser beam energy and the same frequency of the double-pulse laser bombarding the droplet target are used. (If the a TiVCrAl$_2$Si five-component alloy film is deposited, the frequency of the double-pulse laser bombarding the droplet target for Al element is adjusted to be twice that of other elements.)

Pre-deposition is performed on the baffle 10.

After the plasmas formed under the action of the lasers and the droplets are stable, the plasmas of the five types of metals are uniformly mixed after interaction. The baffle 10 is removed, and then the plasmas of the five types of metals are proportionally uniformly deposited on the deposition substrate.

The action period of time of the laser and the droplet is controlled based on the desired film thickness.

A method for preparing a film of a gas compound of an N-component alloy is further provided according to the invention. On the basis of the method for preparing an N-component alloy film, after the vacuum pump group 7 is turned on to pump the chamber to be in the ultimate vacuum degree, the chamber is filled with a preset high-purity gas (such as nitrogen) through the gas inlet member, and the pressure is kept in dynamic balance range in a range from 0.1 Pa to 300 Pa. In this case, the high-temperature plasma formed under the action of the laser beam and the pulsed droplet can be chemically reacted with the filled gas, and the reaction product is deposited on the deposition substrate to form the desired film of the gas compound of the N-component alloy.

The preparation of a five-component alloy TiVCrAlSi nitride film on a Ti-6Al-4V deposition substrate is taken as an example, which specifically includes the following steps.

On the basis of the preparation processes of the five-component alloy TiVCrAlSi film, after the vacuum pump group 7 is turned on in the data collection control unit 6 to pump the chamber to be in an ultimate vacuum degree and before the laser groups 4 and the pulse pressurizing device are turned on, the chamber 1 is filled with the high-purity nitrogen through the gas inlet member, and the pressure is kept in dynamic balance at 30 Pa. In this case, the high-temperature plasma formed under the action of the laser beam and the pulsed droplet can be chemically reacted with the filled nitrogen, and the reacted alloy nitride is deposited on the deposition substrate to form a film of the nitride of the five-component alloy TiVCrAlSi.

A method for preparing a film of which the alloy composition ratio is arbitrarily changed in the thickness direction is further provided according to the invention. A gradient film prepared by depositing chemical compositions from a 316L stainless steel to an Inconel 718 nickel-based alloy in gradient on a 316L stainless steel deposition substrate is taken as an example for illustration, which specifically includes the following steps.

Two alloy liquids of the 316L stainless steel and Inconel718 nickel-based alloy are placed into two metal liquid containers respectively.

The pretreated 316L stainless steel deposition substrate is fixed on the base, and the temperature and the rotation speed of the deposition substrate are controlled by the data collection control unit 6 so that horizontal distances and vertical distances from the injection holes of two metal liquid containers 2 to the center of the deposition substrate are equal separately.

Two matching laser groups 4 are adjusted to ensure that horizontal distances and vertical distances from the action points of light beams emitted from the laser groups 4 and the droplets to the center of the deposition substrate are equal separately.

The vacuum pump group 7 is turned on in the data collection control unit 6 to pump the chamber to be in an ultimate vacuum degree.

Figure 3:
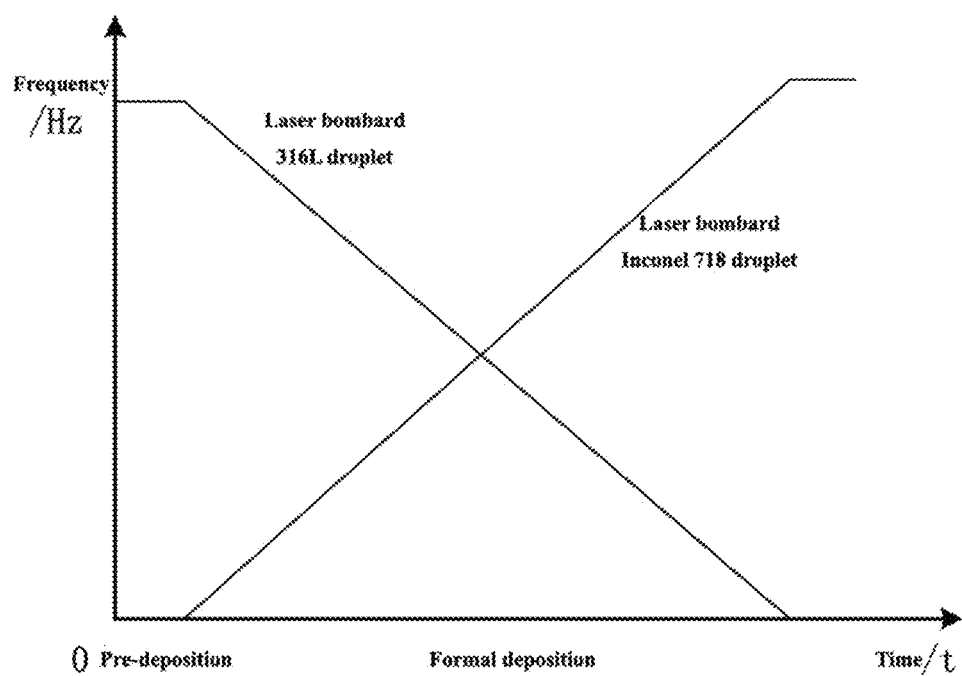
FIG. 3 shows a graph of frequencies of two sets of double-pulse lasers bombarding droplets changing with time in preparing a film with chemical compositions changing in gradient according to an embodiment of the present invention.

The curves in FIG. 3 are drawn in the software of the data collection control unit 6.

The laser groups 4 and the pulse pressurizing device are turned on in the data collection control unit 6 to generate double-pulse lasers and pulsed droplets.

The frequency of the double-pulse laser bombarding the droplet target is automatically adjusted in the software. The content ratio of the 316L stainless steel to the Inconel718 nickel-based alloy in the film deposited on the 316L stainless steel deposition substrate is gradually reduced until it is transitioned to only Inconel718 nickel-based alloy in the film, that is, a gradient film is prepared by depositing chemical compositions from the 316L stainless steel to the Inconel 718 nickel-based alloy in gradient on the 316L stainless steel deposition substrate.

Although it is disclosed above the invention by way of the preferred specific embodiments of the invention, it should be understood that the scope of protection of the invention is not limited thereto. Various modifications and alternations may be made by those skilled in the art without deviation from the technical scope of the invention. Therefore, the scope of protection of the invention should be defined by the scope of protection of the appended claims.

The invention claimed is:

1. An apparatus for preparing a multi-component alloy film, comprising: a chamber to which a vacuum pump group is connected, a plurality of metal liquid containers for containing high-purity metal liquids, a rotatable base for placing a deposition substrate, a plurality of laser groups for generating double-pulse lasers, a base controller, and a data collection control unit;
   the rotatable base is arranged in the chamber, the plurality of metal liquid containers are in communication with the chamber, and each of the metal liquid containers is provided with a pulse pressurizing device for pressing a metal liquid into the chamber in a form of pulsed droplets; the plurality of laser groups are in one-to-one correspondence with the plurality of metal liquid containers, such that a plurality of pulsed droplets are bombarded by the emitted multi-beam double-pulse lasers respectively to generate corresponding plasmas, and the corresponding plasmas are sputtered and deposited on the deposition substrate to form a multi-component alloy film;
   the data collection control unit is used for collecting temperature and displacement information of the rotatable base, and controlling a pressuring frequency of the pulse pressuring device and the emitting frequency and energy of the double-pulse lasers of the plurality of laser groups, thereby controlling the frequency and energy of the double-pulse lasers bombarding the pulsed droplets correspondingly, and realizing the automatic control of plasma film deposition;
   the base controller is used for controlling the temperature, rotation and movement of the base based on the temperature and displacement information of the base collected by the data collection control unit.

2. The apparatus according to claim 1, further comprising a synchronizer trigger that synchronizes the emission of double-pulse laser with the corresponding pulsed droplet in conjunction with the data collection control unit.

3. The apparatus according to claim 1, wherein the apparatus further comprises a detection member, the data collection control unit is used for collecting vacuum degree and gas composition data in the chamber through the detection member to control the pumping of the vacuum pump group;
   the apparatus further comprises gas intake members, one of which is arranged on the chamber to control gas components in the chamber, and a plurality of gas intake members are arranged on the metal liquid containers and are in one-to-one correspondence with the plurality of metal liquid containers.

4. The apparatus according to claim 1, wherein the apparatus further comprises a baffle detachably disposed between the base and an acting surface where action points of all the double-pulse lasers and the pulsed droplets are located;
   the apparatus further comprises a plurality of focusing lenses, the plurality of focusing lenses are disposed in one-to-one correspondence with the plurality of laser groups, each of the focusing lenses is arranged between the corresponding laser group and the action point of the double-pulse laser and the pulsed droplet, such that the focus of the focusing lens is controlled to be exactly at the action point of the double-pulse laser and the pulsed droplet.

5. The apparatus according to claim 3, wherein the pulse pressurizing device is provided with an exciter, and an inert gas enters the metal liquid container from the gas inlet member and is excited by the exciter to form a pulsed gas pressure, which ejects the metal liquid into the chamber in a form of pulsed droplets.

6. The apparatus according to claim 1, wherein an injection hole communicating with the chamber is provided on the center of the bottom of each of the metal liquid containers, horizontal distances and vertical distances from the injection holes to the center of the deposition substrate are equal separately, horizontal distances and vertical distances from the action points of double-pulse lasers and the corresponding pulsed droplets to the center of the deposition substrate are equal separately, all included angles between extension lines of the emitted double-pulse lasers and the plane where the deposition substrate is located are equal.

7. The apparatus according to claim 1, wherein the plurality of metal liquid containers are identical, and the plurality of laser groups are identical;
the pulsed droplets are uniform in size and have diameters in micron level, each beam of the double-pulse lasers is focused through the corresponding focusing lens into a light spot to bombard the corresponding pulsed droplet, and the diameter of the light spot is larger than the diameter of the corresponding pulsed droplet.

8. A method for preparing a multi-component alloy film using the apparatus according to claim 1, wherein placing one metal liquid in each of the metal liquid containers;
fixing the deposition substrate on the base, and controlling the position, temperature and rotation speed of the deposition substrate through the data collection control unit;
turning on the vacuum pump group in the data collection control unit to pump the chamber to be in an ultimate vacuum degree;
presetting the emitted frequency and energy of the double-pulse laser beam of the laser group in the data collection control unit;
turning on the pulse pressurizing device and the laser group in the data collection control unit, to synchronously bombard the corresponding pulsed droplets using the double-pulse laser; and
after plasmas formed based on the action of the double-pulse laser and the pulsed droplets are stable and the plurality of plasmas are uniformly mixed, depositing the plasmas on the deposition substrate to form a multi-component alloy film.

9. The method for preparing a multi-component alloy film according to claim 8, wherein the apparatus further comprises a plurality of focusing lenses, the plurality of focusing lenses are disposed in one-to-one correspondence with the plurality of laser groups;
each beam of the double-pulse lasers is focused through the corresponding focusing lens into a light spot to bombard the corresponding pulsed droplet, the diameter of the light spot is larger than the diameter of the corresponding pulsed droplet, the diameter of the light spot is in a range from 60 µm to 90 µm, the diameter of the droplet is in a range from 30 µm to 40 µm, and the ultimate vacuum degree is $10^{-6}$ Pa.

10. A method for preparing a film of a gas compound of a multi-component alloy using the apparatus according to claim 3, wherein placing one metal liquid in each of the metal liquid containers;
fixing the deposition substrate on the base, and controlling the position, temperature and rotation speed of the deposition substrate through the data collection control unit;
turning on the vacuum pump group in the data collection control unit to pump the chamber to be in an ultimate vacuum degree;
filling the chamber with a high-purity gas through the gas inlet member, and keeping the pressure in dynamic balance in a range from 0.1 Pa to 300 Pa;
presetting the emitted frequency and energy of the double-pulse laser beam of the laser group in the data collection control unit;
turning on the pulse pressurizing device and the laser group in the data collection control unit, to synchronously bombard the corresponding pulsed droplets using the double-pulse laser; and
after plasmas formed based on the action of the double-pulse laser and the pulsed droplets react with the high-purity gas to stably generate gas compounds of alloy, depositing a plurality of the gas compounds of the alloy on the deposition substrate to form a film of a gas compound of a multi-component alloy.

11. A method for preparing a multi-component alloy film with any vary ratio of alloy compositions in the thickness direction using the apparatus according to claim 1, wherein
placing one metal liquid in each of the metal liquid containers according to the type of the pre-prepared alloy film;
fixing the deposition substrate on the base, and controlling the position, temperature and rotation speed of the deposition substrate through the data collection control unit;
turning on the vacuum pump group in the data collection control unit to pump the chamber to be in an ultimate vacuum degree;
according to the variation of the ratio of the pre-prepared alloy in the thickness direction, sequentially drawing a variation curve of frequencies of the double-pulse lasers of the laser groups and frequencies of the corresponding pulsed droplets in the data collection control unit, automatically adjusting the frequency of multi-beam double-pulse lasers bombarding the corresponding pulsed droplet according to the preset frequency variation curve;
turning on the pulse pressurizing device and the laser group in the data collection control unit, to synchronously bombard the corresponding pulsed droplets using the double-pulse laser; and
after plasmas formed based on the action of the double-pulse laser and the pulsed droplets are uniformly mixed, depositing the plasmas on the deposition substrate to form a multi-component alloy film with any vary ratio in the thickness direction.

* * * * *